(12) United States Patent
Bryant et al.

(10) Patent No.: US 6,300,657 B1
(45) Date of Patent: Oct. 9, 2001

(54) SELF-ALIGNED DYNAMIC THRESHOLD CMOS DEVICE

(75) Inventors: Andres Bryant; Edward J. Nowak, both of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/536,503

(22) Filed: Mar. 27, 2000

Related U.S. Application Data

(62) Division of application No. 09/157,691, filed on Sep. 21, 1998, now Pat. No. 6,159,200.

(51) Int. Cl.[7] ................................................. H01L 29/788
(52) U.S. Cl. ............................ 257/318; 257/314; 257/316
(58) Field of Search ............................... 257/66, 91–94, 257/347–51, 365–9, 384, 388, 402, 412; 438/126, 324, 319, 24, 314

(56) References Cited

U.S. PATENT DOCUMENTS

| | | |
|---|---|---|
| 5,082,794 | 1/1992 | Pfiester et al. . |
| 5,266,507 | 11/1993 | Wu . |
| 5,273,921 * | 12/1993 | Neudeck et al. ................. 438/157 |
| 5,461,250 | 10/1995 | Burghartz et al. . |
| 5,510,278 | 4/1996 | Nguyen et al. . |
| 5,559,368 * | 9/1996 | Hu et al. ............................ 257/369 |
| 5,573,961 | 11/1996 | Hsu et al. . |
| 5,750,430 | 5/1998 | Son . |
| 5,851,883 | 12/1998 | Gardner et al. . |
| 5,856,226 | 1/1999 | Wu . |
| 6,043,535 * | 3/2000 | Houston ............................ 257/345 |

OTHER PUBLICATIONS

IEE Transactions on Electron Devices, "Deep Submicrometer Double–Gate Fully–Depleted SOI PMOS Devices: A concise Short–Channel Effect Threshold Voltage Model Using a Quasi–2D Approach", vol. 43, No. 9, Sep. 1996, p. 1387.

Wolf, S. *Silicon Processing for the VLSI Era*. vol. 2: Process Integration, Sunset Beach, CA, 11290, pp. 321–322.

* cited by examiner

*Primary Examiner*—Minh Loan Tran
*Assistant Examiner*—Thomas L Dickey
(74) *Attorney, Agent, or Firm*—DeLio & Peterson, LLC; Peter W. Peterson; Eugene I. Shkurko

(57) ABSTRACT

A method of making a self-aligned dynamic threshold field effect device having a dynamic threshold voltage includes depositing a mandrel layer on the surface of an SOI substrate, then etching a gate opening in the mandrel layer. The gate opening is narrowed by depositing spacer material and a highly doped region, forming a low resistance body region, is created by ion implantation. The narrowed gate opening prevents the low resistance body from connecting the source/drain regions to be formed on opposite sides of the gate-structure. A gate is formed by depositing a dielectric layer in the gate opening, and adding a layer of gate material, then chemical-mechanical polishing to the level of the mandrel layer, then removing the mandrel layer. Conventional processing is then used to create source/drain diffusion regions. The gate is connected to the body by creating a contact region at one end of the gate. The invention includes the device made by the method. The device needs less surface area than previous devices of this type due to the low resistance body and the connection region located at one end of the gate structure, and the method self-aligns the gate and the body region, while accurately controlling their relative sizes.

14 Claims, 3 Drawing Sheets

SELF-ALIGNED DYNAMIC THRESHOLD CMOS DEVICE

This is a divisional of application Ser. No. 09/157,691 filed on Sep. 21, 1998, which issued as U.S. Pat. No. 6,159,200 on Dec. 12, 2000.

BACKGROUND OF THE INVENTION

1. Field of the Invention

This invention relates to self-aligned dynamic threshold field effect devices and the method of making such devices. More specifically, this invention relates to insulated gate field effect devices formed as isolated semiconductor devices, such as with silicon-on-insulator (SOI) technology, where the gate is connected to the body of the device to provide dynamic threshold operation.

2. Description of Related Art

The demand for high performance and low power consumption microelectronic devices has increased with the expansion of the market for portable electronic devices such as laptops, cell phones and the like. Dynamic threshold devices, including insulated gate field effect transistors (IGFETs), MOSFETs and similar devices offer this desirable combination by their ability to operate at extremely low voltages, such as at 0.6 volts or less.

Dynamic threshold devices generally operate by connecting the body of the device to the gate of the device. Making this connection causes the threshold voltage, i.e., the voltage at which the device begins to conduct, to be reduced as compared to conventional CMOS technology which typically has a threshold voltage of 0.6 volts or more.

The reduction in threshold voltage (which is actually a dynamically changing threshold voltage) allows an ultra-low power supply voltage to be used. The reduction in the power supply voltage substantially reduces power consumption of the device. This generally reduces battery weight, decreases the heat dissipation requirements and provides other advantages for the designer of portable electronic devices.

Because the body of each dynamic threshold device must be electrically isolated from the body of each adjacent device, dynamic threshold devices typically are constructed with SOI or bulk triple well technologies.

One difficulty with the production of devices of this type has been the space required for the body contact. Prior designs have placed the body contact along the entire length of the device. This uses valuable device space, but is necessary due to the relatively low conductivity of the body. Another problem has been the necessity for separately aligning the body contact relative to the device.

The present invention addresses these problems by introducing a buried self-aligned highly doped low-resistance body, located below the gate dielectric. The low resistance of the body allows a relatively small area at an end of the device to be used to make connection to the body region. The low-resistance body is constructed in a way which accurately aligns it and places it precisely next to, but not abutting, the source and drain regions.

Bearing in mind the problems and deficiencies of the prior art, it is therefore an object of the present invention to provide a method of making a dynamic threshold field effect device where the surface area used for the body connection is reduced as compared to previous designs.

It is another object of the present invention to provide a method of making a dynamic threshold field effect device having a buried low-resistance body region.

A further object of the invention is to provide a method of making a dynamic threshold field effect device having a buried low-resistance body region wherein the body region is formed by a self-aligning process relative to the gate dielectric and the gate.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of making a dynamic threshold field effect device and the device made by the method. The method starts with a substrate having an isolated semiconductor region defined on a surface thereof. The substrate is typically an SOI substrate.

A mandrel layer is deposited on the surface of the substrate, and a gate opening is etched in the mandrel layer over the semiconductor region. The gate opening is used for subsequently forming elements of the device which are all self-aligned relative to the gate opening in the mandrel layer.

Spacer material is then deposited to narrow the gate opening, and a highly doped body region is then formed in the semiconductor region. The highly doped region is aligned by the narrowed gate opening, and the narrowing assures that subsequently formed diffusion regions on opposite sides of the highly doped region, which form source and drain regions, are not in contact with the low resistance body structure formed by the highly doped region.

The spacer material is then removed and a dielectric layer is formed in the gate opening to form the gate dielectric. Gate material, such as polysilicon or tungsten, is then deposited in the gate opening to at least partially form the gate. The mandrel layer is removed, and source and drain regions are formed next to, but not abutting, the highly doped region.

The highly doped region is typically formed by ion a implantation. Preferably, a sacrificial layer of oxide is grown in the gate opening before the spacer material is deposited and the highly doped region is formed by ion implantation through this sacrificial layer, which protects the surface. The sacrificial layer is removed from the gate opening after the spacer material is removed.

In the most highly preferred aspect of the invention, a contact region is formed, in good electrical contact with the highly doped region, by etching an opening in the dielectric layer and implanting dopant to form the contact region. Also in the preferred method, a first portion of the gate material is deposited in the gate opening prior to etching an opening in the dielectric layer. When the opening is etched in the dielectric layer, an opening is also etched in the first portion of the gate material. A second portion of gate material is then deposited after the contact region is formed, the second portion of gate material being in good electrical contact with the contact region.

When the gate material used is polysilicon, a metal silicide layer is then formed over the gate material.

The invention also includes a dynamic threshold field effect device according to the method. The dynamic threshold field effect device includes a substrate having an isolated semiconductor region defined on a surface thereof. A dielectric layer is formed on the surface of the semiconductor region and a gate is formed above the dielectric layer.

A low-resistance body region is located in the semiconductor region below the dielectric layer and is formed by means of a self aligned process relative to the dielectric layer. The body region is created by the self-aligning process with a width less than the dielectric layer. A contact region is in good electrical contact with the body region and source and drain regions are located on opposite sides of the body region, next to, but not abutting, the body region.

Preferably the contact region is connected to the gate by having the gate overlie the contact region, which is preferred to be located at an end of the device. By positioning the contact region at one end, the area taken up by the device on the substrate is reduced, and proper operation of the device in this configuration is provided by the low resistance of the body region which does not need connection along its length.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
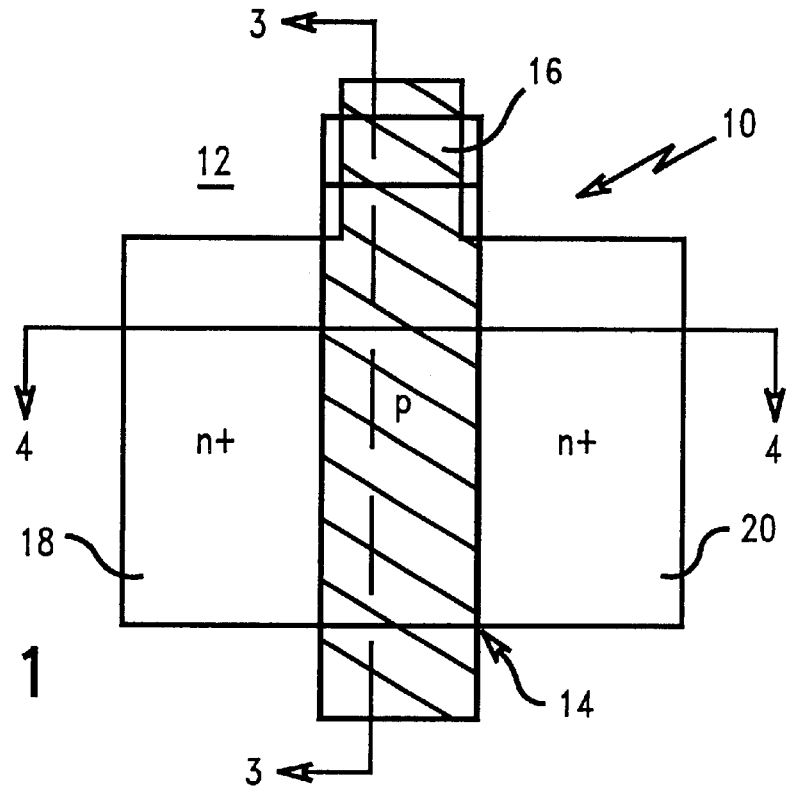
FIG. 1 is a top plan view of a self-aligned dynamic threshold field effect device constructed according to the method of this invention.

In describing the preferred embodiment of the present invention, reference will be made herein to FIGS. 1–4 of the drawings in which like numerals refer to like features of the invention. Features of the invention are not necessarily shown to scale in the drawings.

FIG. 1 shows a top plan view of a self-aligned dynamic threshold field effect device constructed in accordance with this invention. The invention includes an isolated semiconductor region 10 formed on a substrate 12. Typically substrate 12 will be a silicon-on-insulator (SOI) substrate in which a plurality of islands of semiconductor material, forming the semiconductor regions 10, are isolated from electrical contact with each other by an underlying insulating layer 48 and surrounding trenches 50 (see FIGS. 3a and 4a).

Figure 3A:
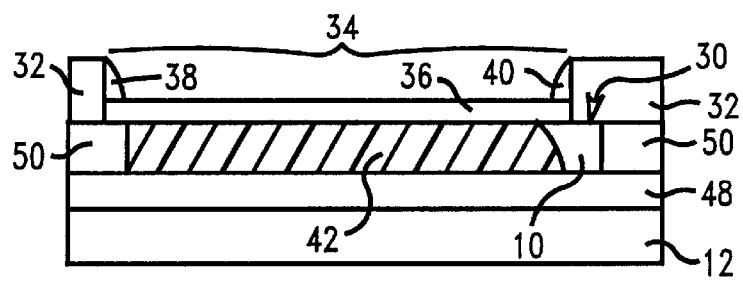
FIGS. 3a–3g are cross sectional views taken along the line 3—3 in FIG. 1 showing sequential stages in the construction of a self-aligned dynamic threshold field effect device according to the method of this invention.

The isolation material in the SOI insulating layer 48 and trenches 50 is typically silicon dioxide. The SOI substrate may be made by any of the well known SOI substrate construction techniques. As seen in FIGS. 3a and 4a, the semiconductor regions 10 sit on top of insulating layer 48 which typically sits on top of a base layer of silicon. The semiconductor regions 10 are isolated from the base layer of silicon of the substrate 12 by the underlying insulating layer 48. FIGS. 3b–3g and 4b–4g have omitted showing the base layer of the substrate 12, and show only the underlying layer 48 of insulating oxide. The isolation of the semiconductor region 10 may also be achieved through the use of triple well technology in which the isolation is provided by multiple p-n boundaries.

The semiconductor region 10 includes an elongated gate structure generally indicated with reference numeral 14 and a contact region 16 located at one end thereof. Diffusion regions 18, 20 are located on opposite sides of the elongated gate structure 14 and act as source and drain regions for the field effect device.

Figure 2:
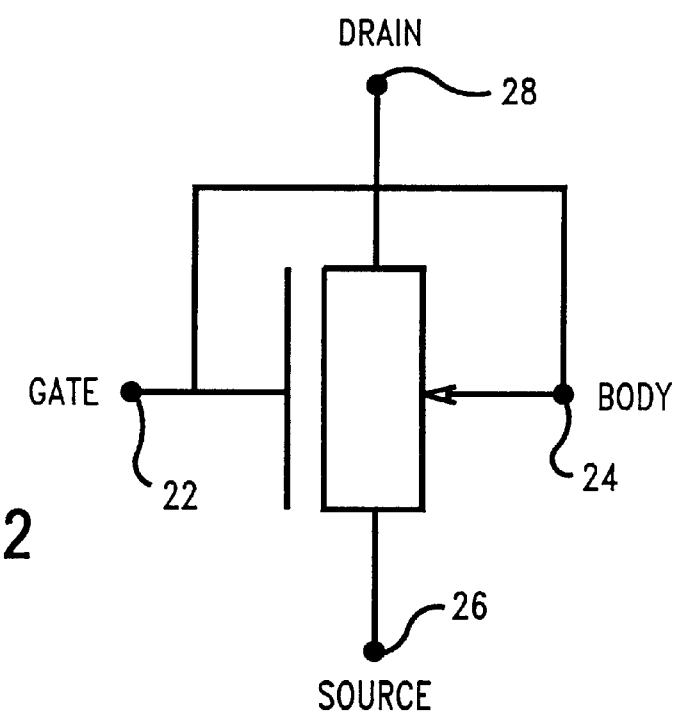
FIG. 2 is a schematic circuit diagram of a self-aligned dynamic threshold field effect device constructed according to the method of this invention.

FIG. 2 shows a simplified circuit diagram of the device indicating how the gate 22 is connected to the body of the device 24. The source 26 and drain 28 in FIG. 2 correspond to the diffusion regions 18 and 20 in FIG. 1. The illustrated connection between the gate 22 and the body of the device 24 provides the desired dynamic threshold operation. This connection is achieved through the relatively small contact region 16 located at an end of the elongated gate structure 14 of FIG. 1.

FIG. 3a is taken in cross section along the line 3—3 in FIG. 1. This cross section shows the device at an early stage during construction of the device and is taken approximately along the longitudinal axis of the elongated gate structure 14. This cross section shows that semiconductor region 10 includes an upper surface 30 having a mandrel layer 32 applied thereon. Preferably the mandrel layer is constructed of silicon nitride which, in the preferred embodiment, has a thickness of 200 nanometers.

After the mandrel layer 32 is applied, a gate opening 34 is defined and etched into the mandrel layer 32. The gate opening in the mandrel layer acts to form the gate structure 14 and serves to maintain alignment of all the elements of the gate structure during subsequent processing steps. The gate opening 34 is constructed using conventional techniques with resist and etching.

After the gate opening is formed, a layer of sacrificial oxide 36 is formed in the gate opening 34 to protect the exposed surface 30. Spacer material is then added and etched in a conventional manner to produce spacers 38, 40, 44 and 46 (seen in FIGS. 3a and 4a) around the entire inner edge of the gate opening 34. The spacers 44 and 46 narrow the width of the gate opening.

After the spacers are added to narrow the width of the gate opening, a highly doped body region 42 is formed in the narrowed gate opening, preferably by ion implantation of boron at a concentration of $10^{15}/cm^2$ at 90 keV. In the embodiment shown in the drawings, the highly doped body region 42 is a p+ channel which has a relatively low resistance. The low resistance allows connection to be made at only one end of the highly doped body region 42 which acts as a second gate structure buried within the semiconductor region.

FIG. 4a shows the structure taken along the cross sectional line 4—4 in FIG. 1 at the same point in processing as is shown in FIG. 3a. The spacers 38, 40, 44 and 46 all narrow the width of the gate opening 34 and ensure that the width of the highly doped body region 42 is less than the width of the gate opening 34. Because the highly doped body region 42 is a low resistance region, the restriction on its width prevents this region from directly abutting the source and drain diffusion regions 18, 20 (to be constructed in a later step). Such direct connection would introduce parasitic currents from the body to the source and drain. The separation of the body region 42 from the source and drain diffusion regions 18, 20 can be seen best in FIG. 4g.

The semiconductor region 10 of the SOI substrate is isolated from adjacent semiconductor regions on the SOI substrate by the underlying oxide layer 48 and oxide trenches 50, 52 on either side. The oxide trenches are typically constructed by conventional shallow trench isolation (STI) techniques.

Figure 3B:
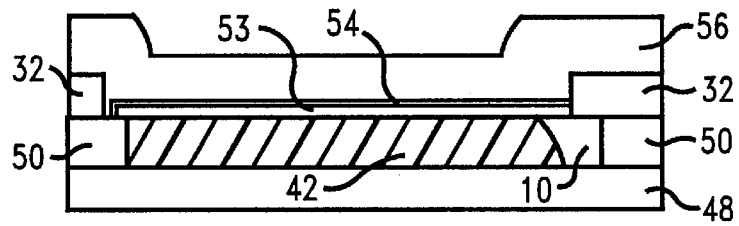
Figure 4A:
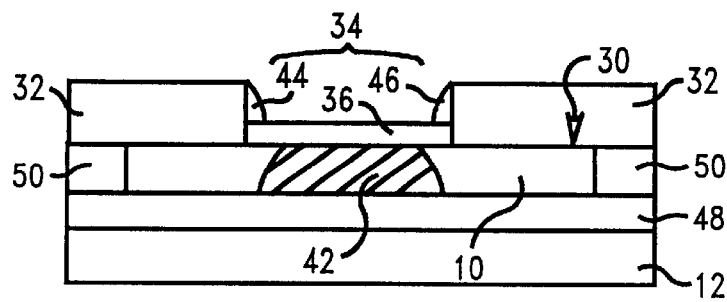
FIGS. 4a–4g are cross sectional views taken along the line 4—4 in FIG. 1 showing sequential stages in the construction of a self-aligned dynamic threshold field effect device according to the method of this invention.
Figure 4B:
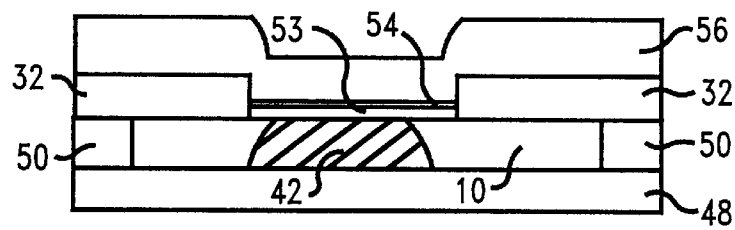

FIGS. 3b and 4b show the field effect device after several additional steps in the method of this invention. After the highly doped p+ body region 42 is formed, including any surface well implants to adjust threshold voltage or other device parameters, the spacer material 38, 40, 44 and 46 is removed and the sacrificial oxide 36 is etched away. Although protection of the surface 30 during ion implantation with a layer of sacrificial oxide is preferred, the use of this sacrificial oxide layer is optional.

In the most highly preferred method of the invention, after removal of the sacrificial oxide layer 36, a layer of p-type or n-type, as appropriate, monocrystalline silicon 53 is epitaxially grown at low temperature in the gate opening 34 to leave a low-doped region of silicon above the highly-doped body region 42. In the preferred implementation of the invention, this layer of monocrystalline silicon 53 was epitaxially grown at a temperature of about 500° C. to produce a layer approximately 25 nanometers thick having a doping of about $10^{15}$ cm$^{-3}$. The thickness and doping concentration are chosen to give desirable threshold-voltage characteristics, typically about 250 millivolts.

Next, an insulating layer forming a gate dielectric 54 is created over the monocrystalline silicon layer 53 by either oxidation of the exposed silicon or by deposition of insulating films.

After production of the gate dielectric 54, a first layer of conductive gate material 56, is then deposited on the device. This layer of gate material is deposited with a thickness approximately 20% greater than the thickness of the mandrel material to fill the gate opening 34. FIGS. 3b and 4b show the device after deposition of this first layer of gate material 56. The first layer of gate material 56 may be either intrinsic polysilicon, n$^+$-doped polysicon or a refractory metal, such as tungsten.

Following the production of this first layer of gate material 56, the device is planarized using chemical-mechanical polishing (CMP) with the mandrel layer 32 acting as an etch stop. This leaves a planar surface, level with the upper surface of the mandrel layer, with the gate opening 34 now filled with the first layer of gate material 56.

Figure 3C:
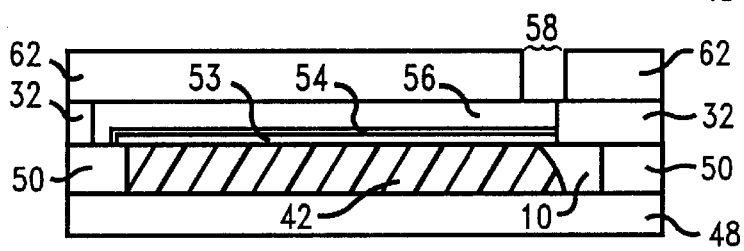
Figure 4C:
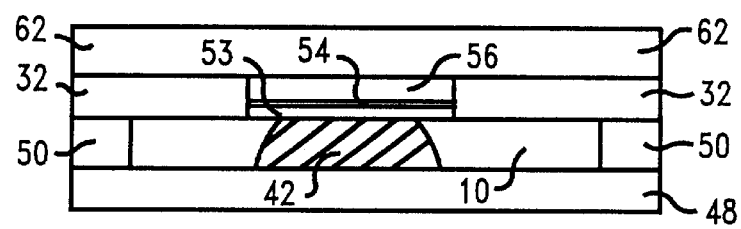

A contact opening 58 is then defined at one end of the elongated gate opening, with conventional techniques, using resist material 62. This is done in substantially the same way as the gate opening 34 was created. FIGS. 3c and 4c show the device after contact opening 58 has been defined in resist material 62.

The contact opening 58 is then etched through the gate material 56. Although the etching may go completely through the gate dielectric layer 54 to expose the body of the device and subsequently allow direct connection thereto, it is preferable to stop the etch at the gate dielectric layer 54, leaving the gate dielectric layer on surface 30 to protect it for a subsequent p$^+$ ion implantation. The p$^+$ ion implantation, typically doped at $3 \times 10^{15}$ cm$^{-2}$ at 20 keV, is optionally performed to improve body contact resistance in the body contact region 16. After ion implantation, the remaining gate oxide in contact opening 58 is removed to expose the body contact region 16.

The contact region 16 provides good, electrical contact with the highly doped body region 42. This connection to the body provides the dynamic threshold performance of the present invention.

Figure 3D:
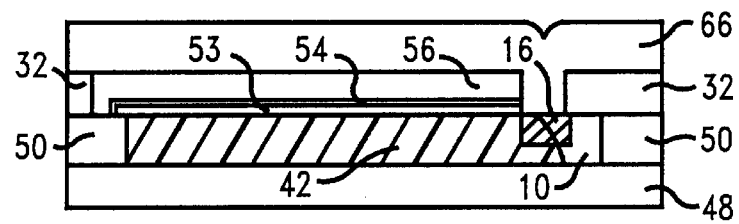
Figure 4D:
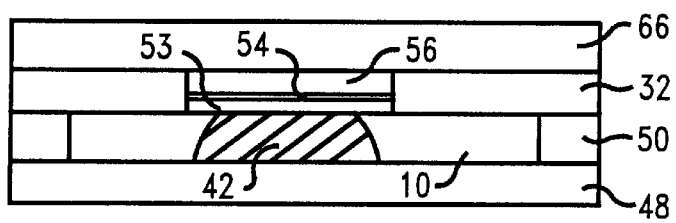

After the contact region 16 is produced, a second layer 66 of a conductive gate material, such as boron doped polysilicon, or tungsten, or other refractory metal, of thickness approximately 20% greater than that of the mandrel thickness, is deposited over the entire structure. A thickness of 200 nanometers of boron-doped polysilicon was used in the production of the preferred embodiment of this invention, however this may be varied. FIGS. 3d and 4d show the device after this second layer 66 of conductive gate material has been deposited.

Figure 3E:
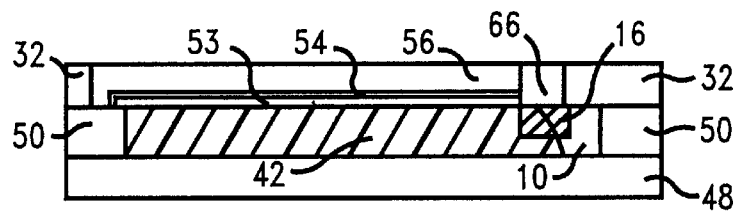
Figure 4E:
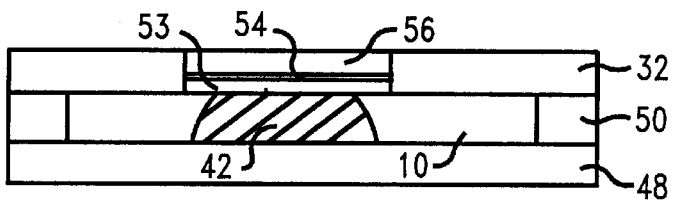

The second layer 66 of conductive gate material is then CMP polished, again using the mandrel layer 32 as an etch stop. The device is then left with a planar surface having a plug 66 of the second layer of gate material in contact with the body through the contact region 16 and in contact with the first layer of gate material 56 above the gate dielectric layer 54. This allows a single conventional connection to the gate to be used to make the connection to the highly doped body region as well and does not require any additional surface area on the device for this connection. FIGS. 3e and 4e show the device at this stage of construction.

Figure 3F:
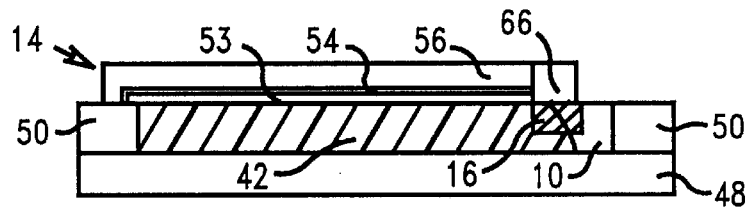
Figure 3G:
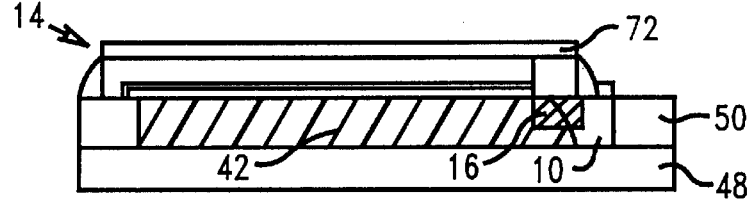
Figure 4F:
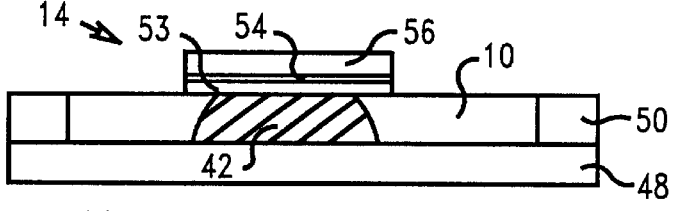

The mandrel layer 32 is then removed, leaving the exposed gate structure 14. FIGS. 3f and 4f show the device at this point in the manufacturing process.

When the first and second gate materials used are both polysilicon, a metal silicide layer 72 (see FIG. 4g) is formed over the entire gate region after n$^+$ source/drain ion implantation and anneals. In this case the second gate material is doped with a sufficient quantity of boron (or other p-type dopant) such that it remains p-type even after exposure to the n-type source/drain ion implantation. The silicide ensures electrical connection of the body contact to the gate electrode.

After creation of the gate structure seen in FIGS. 3f and 4f, the device is ready for the manufacturing steps used conventionally to form a field effect device, except that the device, so constructed, has the built in connection to the low-resistance body region.

Figure 4G:
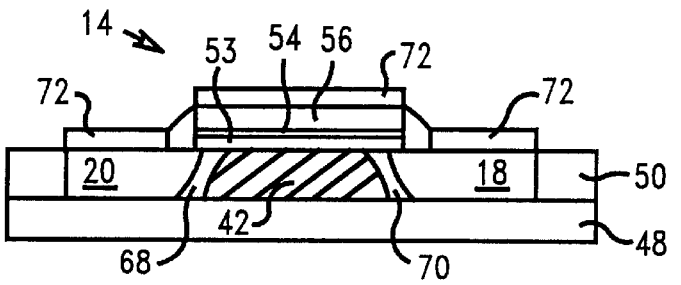

As shown in FIG. 4g, the source and drain diffusion regions 18, 20 are conventionally formed on opposite sides of the gate structure 14, which places them near to, but not in electrical contract with, the body region 42. The narrowed width of the body region 42 produced by the spacers 44, 46 seen in FIG. 4a ensures that the width of the body region 42 is less than the width of the gate 14 and the gate dielectric 54. The gate 14 and gate dielectric 54 limit the approach of the diffusion regions 18, 20 to the body region 42 leaving the small separation regions 68, 70 of the semiconductor region 10. These separation regions prevent the low resistance of body region 42 from connecting and shorting out the two diffusion regions 18, 20.

As discussed above, when the gate material is doped polysilicon, a conventional silicidation process follows in which a suitable metal, such as titanium or cobalt, is deposited over the entire surface of the source, drain and gate regions. The deposited metal is then sintered, typically about 700°C, to form the metal silicide 72. The unreacted metal is then selectively removed by chemical etching. Thus the n$^+$ doped gate and p$^+$ doped body contact region (FIG. 3c) are electrically connected by metal silicide layer 72.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A self-aligned dynamic threshold field effect device comprising:
    a substrate having an isolated semiconductor region defined on a surface thereof;
    a dielectric layer formed above the surface of the semiconductor region;
    a gate formed above the dielectric layer;
    a body region having low resistance formed in the semiconductor region below the dielectric layer, the body region being formed by a self aligned process relative to the gate and having a width less than the gate;
    a contact region in good electrical contact with the body region; and
    a source region and a drain region located on opposite sides of the body region, next to, but not abutting, the body region.

2. A self-aligned dynamic threshold field effect device according to claim 1 wherein the substrate is a silicon-on-insulator substrate.

3. A self-aligned dynamic threshold field effect device according to claim 1 wherein the gate is an elongated structure and the contact region is located at an end of the gate.

4. A self-aligned dynamic threshold field effect device according to claim 3 wherein the contact region is produced by ion implantation.

5. A self-aligned dynamic threshold field effect device according to claim 3 wherein the gate overlies the contact region and is in good electrical contact with the contact region.

6. A self-aligned dynamic threshold field effect device according to claim 1 wherein the low resistance body region is formed by ion implantation.

7. A self-aligned dynamic threshold field effect device according to claim 1 wherein the body region is formed through an opening in a mandrel layer.

8. A self-aligned dynamic threshold field effect device according to claim 7 wherein the opening in the mandrel layer is narrowed by spacers before the body region is formed and the dielectric layer is formed through the opening in the mandrel layer after the spacers are removed.

9. A self-aligned dynamic threshold field effect device according to claim 1 wherein the gate includes a first portion of gate material located above the low resistance body region and a second portion of gate material located above the contact region, the first and second portions of gate material being connected together by a layer of metal silicide.

10. A self-aligned dynamic threshold field effect device according to claim 1 further including a layer of silicon located between the dielectric layer and the low resistance body region.

11. A self-aligned dynamic threshold field effect device according to claim 10 wherein the layer of silicon between the dielectric layer and the low resistance body region comprises a layer of monocrystalline silicon.

12. A self-aligned dynamic threshold field effect device according to claim 10 wherein the layer of silicon between the dielectric layer and the low resistance body region comprises a layer of epitaxially, grown silicon.

13. A self-aligned dynamic threshold field effect device according to claim 12 wherein the layer of epitaxially grown silicon is a layer of silicon grown at a temperature of about 500° C.

14. A self-aligned dynamic threshold field effect device constructed according to a method comprising the steps of:
    providing a substrate having an isolated semiconductor region defined on a surface thereof;
    depositing a mandrel layer on the surface of the substrate;
    etching a gate opening in the mandrel layer over the semiconductor region;
    depositing spacer material to narrow the gate opening;
    forming a highly doped region in the semiconductor region, the highly doped region being aligned by the narrowed gate opening;
    removing the spacer material;
    forming a dielectric layer in the gate opening;
    depositing gate material in the gate opening;
    removing the mandrel layer; and
    forming source and drain regions next to, but not abutting, the highly doped region.

* * * * *